(12) United States Patent
Kim et al.

(10) Patent No.: US 11,086,467 B2
(45) Date of Patent: Aug. 10, 2021

(54) DISPLAY DEVICE

(71) Applicant: SAMSUNG DISPLAY CO., LTD., Yongin-si (KR)

(72) Inventors: Jonghwa Kim, Yongin-si (KR); Iljoo Kim, Yongin-si (KR); Kyungsu Lee, Yongin-si (KR); Jeongyun Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/530,807

(22) Filed: Aug. 2, 2019

(65) Prior Publication Data

US 2020/0042123 A1 Feb. 6, 2020

(30) Foreign Application Priority Data

Aug. 3, 2018 (KR) .................. 10-2018-0090692

(51) Int. Cl.
*G06F 3/047* (2006.01)
*H01L 51/00* (2006.01)
*H01L 51/52* (2006.01)
*H01L 27/32* (2006.01)

(52) U.S. Cl.
CPC .......... *G06F 3/047* (2013.01); *H01L 51/0096* (2013.01); *H01L 51/5275* (2013.01); *H01L 27/3244* (2013.01); *H01L 51/5253* (2013.01)

(58) Field of Classification Search
CPC . G06F 3/047; H01L 51/0096; H01L 51/5275; H01L 51/5253; H01L 27/3244
See application file for complete search history.

(56) References Cited

U.S. PATENT DOCUMENTS

| | | | |
|---|---|---|---|
| 2016/0170523 A1 | 6/2016 | Park et al. | |
| 2016/0306478 A1* | 10/2016 | Lai | G06F 1/1626 |
| 2017/0031501 A1* | 2/2017 | Lee | G06F 3/044 |
| 2017/0293380 A1 | 10/2017 | Chauveau et al. | |
| 2017/0301280 A1* | 10/2017 | Ka | G09G 3/3406 |
| 2018/0068156 A1 | 3/2018 | Jang et al. | |

FOREIGN PATENT DOCUMENTS

| | | |
|---|---|---|
| KR | 10-2016-0072909 | 6/2016 |
| KR | 10-2017-0015821 | 2/2017 |
| KR | 10-2017-0119270 | 10/2017 |
| KR | 10-2018-0026597 | 3/2018 |

* cited by examiner

*Primary Examiner* — Kenneth B Lee, Jr.
(74) *Attorney, Agent, or Firm* — F. Chau & Associates, LLC

(57) ABSTRACT

A display device includes a display panel that includes a concave portion at a side of the display panel; and an input detection unit disposed over the display panel. The input detection unit includes a plurality of first detection electrodes electrically connected to each other in a first direction, a plurality of second detection electrodes electrically connected to each other in a second direction perpendicular to the first direction, and a connection wire that electrically connect a pair of the first detection electrodes of the plurality of first detection electrodes disposed at both sides of the concave portion, and the connection wire includes a plurality of segments separate from each other and conjunction portions that electrically connect two adjacent segments to each other.

20 Claims, 7 Drawing Sheets

DISPLAY DEVICE

CROSS-REFERENCE TO RELATED APPLICATION

This application claims priority under 35 U.S.C. § 119 from, and the benefit of, Korean Patent Application No. 10-2018-0090692, filed on Aug. 3, 2018 in the Korean Intellectual Property Office, the contents of which are herein incorporated by reference in their entirety.

BACKGROUND

1. Technical Field

One or more embodiments are directed to a display device, and more particularly, to a display device that includes an input detection unit.

2. Discussion of the Related Art

Various display devices used in a multimedia apparatuses such as televisions, cellular phones, tablet computers, navigation systems, game machines, etc., are being developed. The display devices include a keyboard, a mouse, etc., as input devices. The display devices also include a touch panel as an input device.

SUMMARY

One or more embodiments include a display device that includes an input detection unit that can prevent defects from occurring due to electrostatic discharge.

According to one or more embodiments, a display device includes: a display panel that includes a concave portion at a side of the display panel; and an input detection unit disposed over the display panel, wherein the input detection unit includes a plurality of first detection electrodes electrically connected to each other in a first direction, a plurality of second detection electrodes electrically connected to each other in a second direction perpendicular to the first direction, and a connection wire that electrically connects a pair of the first detection electrodes disposed at both sides of the concave portion, and the connection wire includes a plurality of segments separate from each other and conjunction portions that electrically connect two adjacent segments to each other.

The input detection unit may further include a connector that connects two adjacent first detection electrodes, and a bridge electrode that connect two adjacent second detection electrodes, the connector may be disposed on a same layer as that of the first detection electrodes and the second detection electrodes, and the bridge electrode may be disposed on a different layer from that of the first detection electrodes and the second detection electrodes, and the conjunction portion may be disposed on a same layer as that of the first detection electrodes and the second detection electrodes, and the plurality of segments may be disposed on a same layer as that of the bridge electrode.

The input detection unit may further include a first insulating layer between the bridge electrode and the second detection electrodes and between the segments and the conjunction portion, and the bridge electrode may be connected to the second detection electrodes via first contact holes formed in the first insulating layer, and the segments may be connected to the conjunction portions via second contact holes formed in the first insulating layer.

The bridge electrode may be disposed on a layer lower than that of the second detection electrodes, the input detection unit may further include a second insulating layer disposed over the conjunction portion, and a refractive index of the first insulating layer may be less a refractive index that of the second insulating layer.

The input detection unit may include a touch area in which the plurality of first detection electrodes and the plurality of second detection electrodes are disposed, and the connection wire may be disposed outside the touch area.

The input detection unit may include a connection line connected to the plurality of first detection electrodes or the plurality of second detection electrodes, and a dummy line in a floating state, where the connection line and the dummy line may be disposed outside the touch area, and the dummy line may be disposed between the connection line and the connection wire.

The dummy line may include a cut portion obtained by removing a part of the dummy line, and the plurality of segments respectively further comprise an expanded portion that may extend from the end of the plurality of segments into the cut portion.

The input detection unit may be disposed directly on the display panel.

The display panel may include an organic light-emitting device.

According to one or more embodiments, a display device includes: a display panel that includes a concave portion at a side of the display panel; and an input detection unit disposed over the display panel, wherein the input detection unit includes a plurality of first detection electrode arrays in which a plurality of first detection electrodes are electrically connected to each other and extend parallel to each other in a first direction, and the plurality of first detection electrode arrays are spaced apart from each other in a second direction perpendicular to the first direction, a first detection electrode array of the plurality of first detection electrode arrays is cut by the concave portion and includes a pair of first detection electrodes disposed at both sides of the concave portion, and the pair of first detection electrodes are electrically connected to each other via a connection wire that bypasses the concave portion, and a resistance value of the cut first detection electrode array is identical to a resistance value of the other detection electrode arrays of the plurality of first detection electrode arrays in which the first detection electrodes are consecutively disposed.

The connection wire may include a plurality of separate segments, and conjunction portions that electrically connect adjacent segments of plurality of separate segments to each other.

The input detection unit may include a touch area in which the plurality of first detection electrodes are disposed, and the connection wire may be disposed outside the touch area.

The input detection unit may further include a plurality of second detection electrodes electrically connected to each other in the second direction.

The input detection unit may further include a connection line connected to the plurality of first detection electrodes or the plurality of second detection electrodes, and a dummy line in a floating state that may be disposed outside the touch area, where the dummy line may be disposed between the connection line and the connection wire.

The dummy line may include a cut portion obtained by removing a part of the dummy line, and the plurality of segments may respectively further include an expanded portion that may extend from the end of the plurality of segments into the cut portion.

The input detection unit may further include a connector that connects two adjacent first detection electrodes, and a bridge electrode that connects two adjacent second detection electrodes, where the connector may be disposed on a same layer as that of the first detection electrodes and the second detection electrodes, and the bridge electrode may be disposed on a different layer from that of the second detection electrodes, and the conjunction portion may be disposed on a same layer as that of the first detection electrodes and the second detection electrodes, and the plurality of segments are disposed on a same layer as that of the bridge electrode.

The input detection unit may further include a first insulating layer between the bridge electrode and the second detection electrodes and between the plurality of segments and the connector, and the bridge electrode may be connected to the second detection electrodes via first contact holes formed in the first insulating layer, and the plurality of segments may be connected to the connector via second contact holes formed in the first insulating layer.

The bridge electrode may be disposed on a layer lower than that of the second detection electrodes, the input detection unit may further include a second insulating layer disposed over the conjunction portion, and a refractive index of the first insulating layer may be less than a refractive index of the second insulating layer.

The display panel may include an organic light-emitting device and an encapsulation layer that protects the organic light-emitting device, and the input detection unit may be disposed directly on the encapsulation layer.

According to one or more embodiments, a display device includes: a display panel that includes a concave portion at a side of the display panel; and an input detection unit disposed over the display panel. The input detection unit includes a plurality of first detection electrodes electrically connected to each other in a first direction and spaced apart from each other in a second direction perpendicular to the first direction, a plurality of second detection electrodes electrically connected to each other in the second direction, a connection wire that electrically connects a pair of the first detection electrodes disposed at both sides of the concave portion that are separated by the concave portion, a connector that connects two adjacent first detection electrodes, and a bridge electrode that connect two adjacent second detection electrodes. The connector is disposed on a same layer as that of the first detection electrodes and the second detection electrodes, and the bridge electrode is disposed on a different layer from that of the second detection electrodes.

BRIEF DESCRIPT ON OF THE DRAWINGS

DETAILED DESCRIPTION

Figure 1:
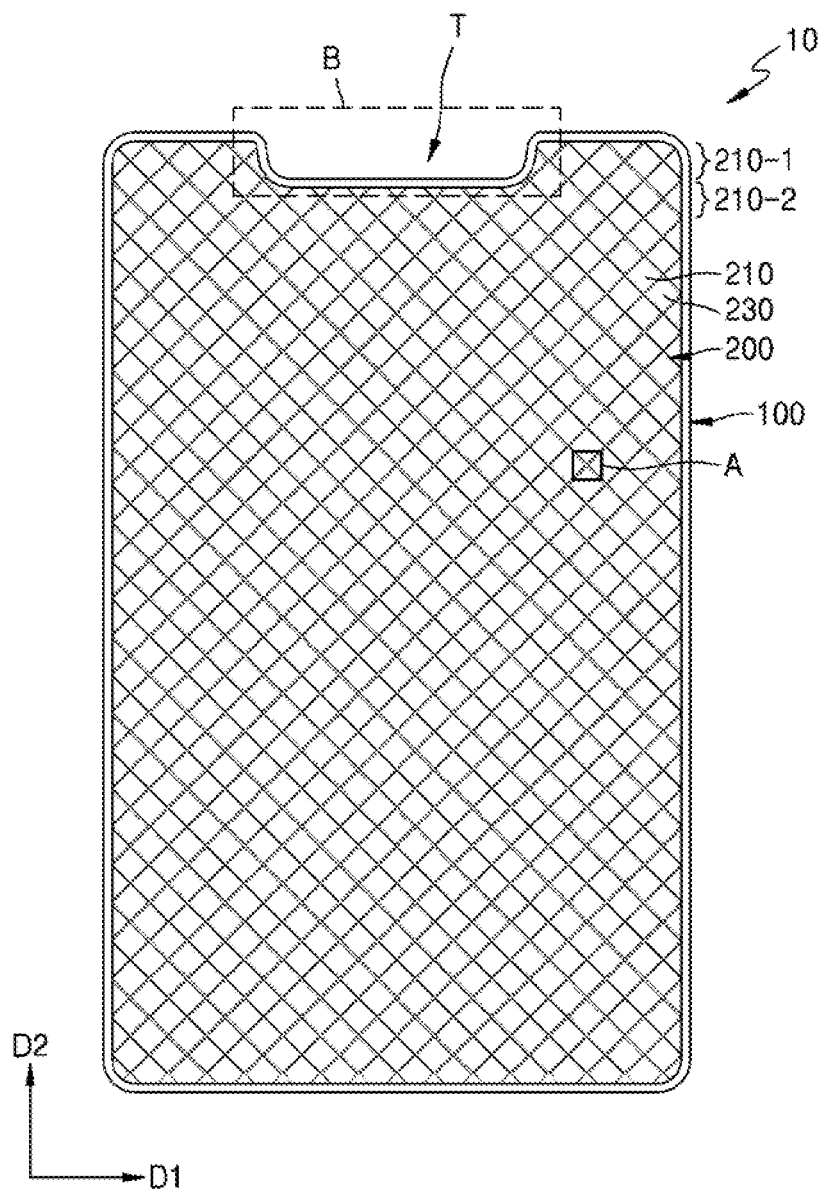
FIG. 1 is a schematic plan view of a display device according to an embodiment.

Reference will now be made in detail to embodiments, examples of which are illustrated in the accompanying drawings, wherein like reference numerals may refer to like elements throughout. In this regard, embodiments may have different forms and should not be construed as being limited to the descriptions set forth herein. Accordingly, embodiments are merely described below, by referring to the figures, to explain aspects of the present description. The present disclosure may, however, be embodied in many different forms and should not be construed as being limited to the embodiments set forth herein.

It will be understood that when a layer, region, or component is referred to as being "formed on," another layer, region, or component, it can be directly or indirectly formed on the other layer, region, or component.

Sizes of elements in the drawings may be exaggerated for convenience of explanation.

Hereinafter, embodiments will be described in detail with reference to the accompanying drawings. Like reference numerals may denote like elements throughout the drawings.

Figure 6:
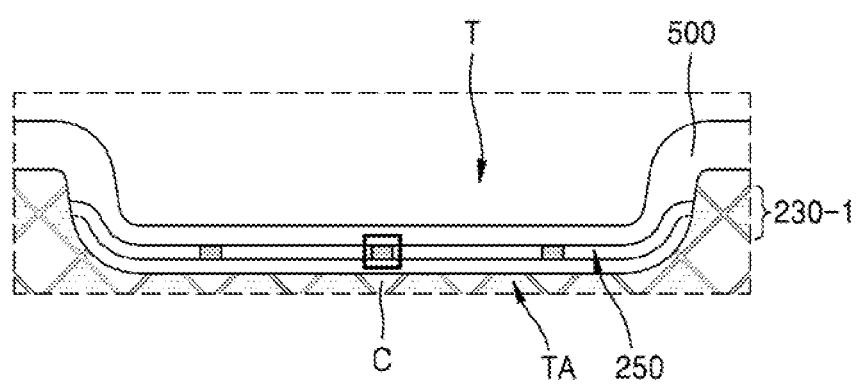
FIG. 6 is a schematic plan view of part B of FIG. 1.

FIG. 1 is a schematic plan view of a display device 10 according to an embodiment. FIG. 6 is a schematic plan view of part B of FIG. 1.

Referring to FIG. 1, according to an embodiment, the display device 10 includes a display panel 100 and an input detection unit 200 disposed above the display panel 100. In addition, the display device 10 includes a concave portion T that has a side that is recessed inward from an edge of the display device 10. In other words, the display panel 100 and the input detection unit 200 have a side that is recessed in correspondence with that of the concave portion T of the display device 10. A component that expands functionality of the display device 10, such as a camera module, a speaker, a sensor, etc., can be disposed in the concave portion T.

According to an embodiment, the display panel 100 displays an image. The input detection unit 200 includes first detection electrodes 210 and second detection electrodes 230 that can detect a contact with an external touch input unit such as a user's hand or a pen, thereby generating an input signal.

According to an embodiment, first detection electrodes 210 are connected to each other in a first direction D1 to form a plurality of first detection electrode arrays 210-1 and 210-2 that extend parallel to each other in the first direction D1. In addition, the plurality of first detection electrode arrays 210-1 and 210-2 are spaced apart from each other in a second direction D2 perpendicular to the first direction D1.

According to an embodiment, the first detection electrodes 210 in a region near the concave portion T are prevented from being consecutively disposed in the first direction D1 by the concave portion T. For example, when the concave portion T extends to a position of the first detection electrode array 210-1, a pair of the first detection electrodes 210 positioned at both sides of the concave portion T are not directly connected to each other. Accordingly, in an embodiment, a connection wire 250 shown in FIG. 6 that bypasses the concave portion T is used to electrically connect the pair of first detection electrodes 210 to each other.

According to an embodiment, a width of the connection wire 250 of FIG. 6 can be adjusted so that a resistance value of the first detection electrode array 210-1 that includes the pair of first detection electrodes 210 electrically connected to each other via the connection wire 250 is same as that of the other first detection electrode array 210-2 in which the first detection electrodes 210 are consecutively disposed.

According to an embodiment, the second detection electrodes 230 are disposed between the first detection electrodes 210 and are connected to each other in the second direction D2 and extend parallel to each other in the second direction D2. Accordingly, since consecutive connections of the second detection electrodes 230 are not obstructed by the concave portion T, a bypass wire for electrically connecting the second detection electrodes 230 to each other is not needed.

According to an embodiment, FIG. 1 shows an example in which the first detection electrodes 210 and the second detection electrodes 230 have a diamond shape. However, the first detection electrodes 210 and the second detection electrodes 230 are not limited thereto, and may have various shapes.

Figure 2:
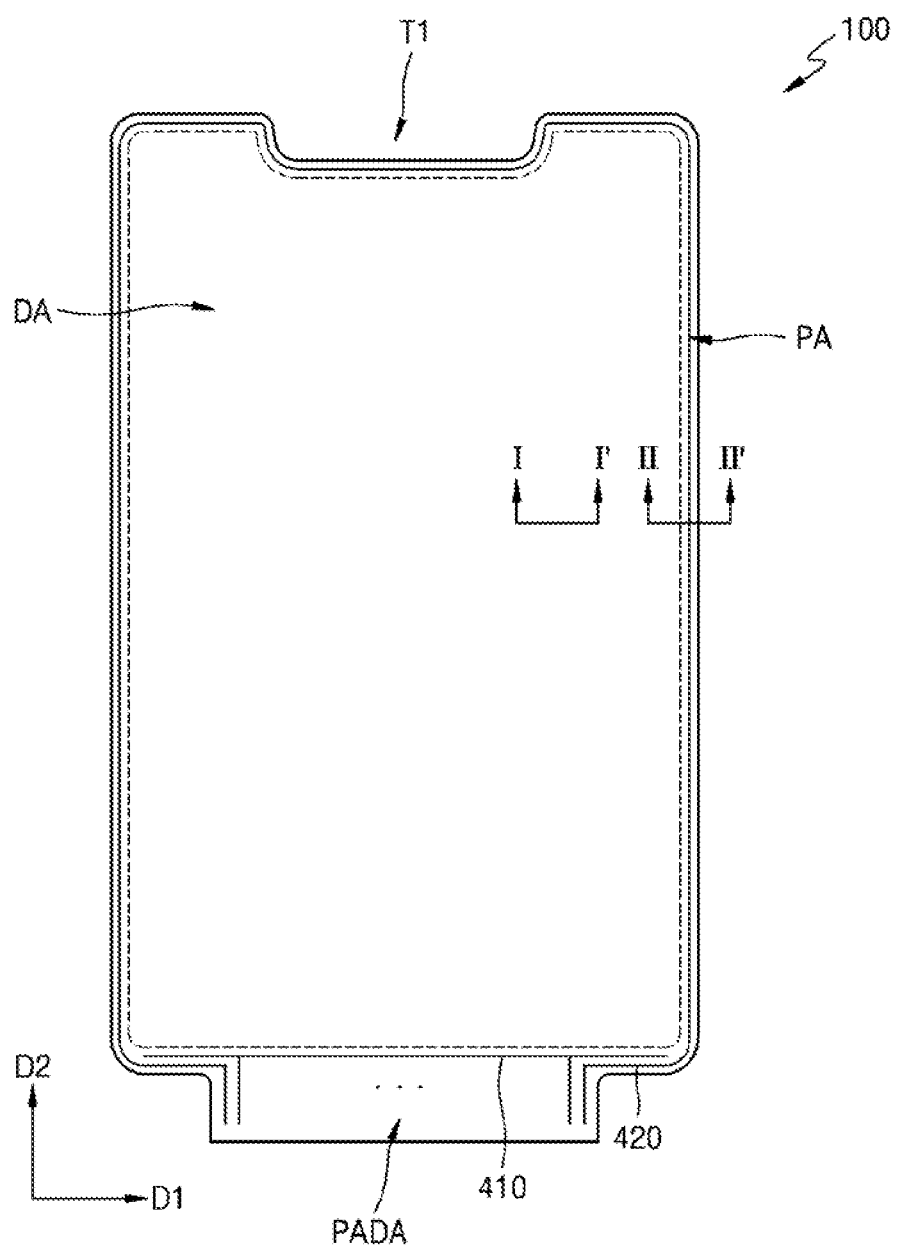
FIG. 2 is a schematic plan view of an example of a display panel of the display device of FIG. 1.
Figure 3:
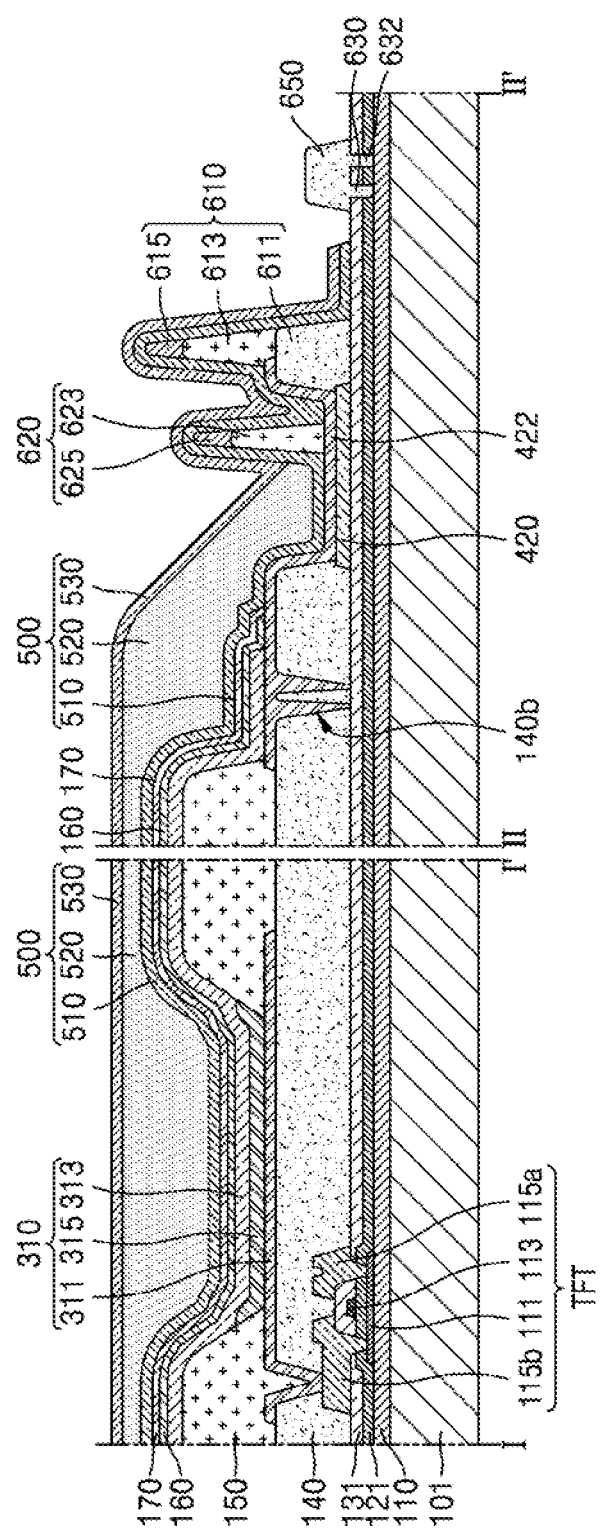
FIG. 3 is a schematic cross-sectional view of a display panel of FIG. 2 taken along lines I-I' and line II-II'.

FIG. 2 is a schematic plan view of an example of a display panel 100 of the display device 10 of FIG. 1. FIG. 3 is a schematic cross-sectional view of an example of the display panel 100 of FIG. 2 taken along lines I-I' and line II-II'.

Referring to FIGS. 2 and 3, according to an embodiment, the display panel 100 has a concave portion T1 having a side that is recessed inward from an edge of the display panel 100, in correspondence with the concave portion T of FIG. 1. The display panel 100 has a display area DA that displays an image and a peripheral area PA disposed outside the display area DA that surrounds the display area DA. The peripheral area PA includes a pad area PADA to which various electric devices or printed circuit boards are electrically attached, and voltage lines 410 and 420 are disposed in the peripheral area PA. The side of the display panel 100 having the concave portion T1 is opposite to that of the pad area PADA.

According to an embodiment, FIG. 2 is a plan view of the substrate 101 when the display panel 100 is manufactured. In the finished display panel 100 or an electronic device such as a smartphone, etc., that includes the display panel 100, a part of the substrate 101, etc., is bent to minimize an area of the peripheral area PA recognized by a user. For example, the substrate 101 is bent between the pad area PADA and the display area DA so that at least a part of the pad area PADA overlaps the display area DA. A bent direction is determined so that the pad area PADA does not cover the display area DA but is positioned behind the display area DA. Accordingly, a user can recognize that the display area DA occupies a greater part of the display device 10 of FIG. 1.

In addition, according to an embodiment, left and right edges of the display area DA are bent to protrude outwards. Thus, when the display device 10 of FIG. 1 is viewed from the front, neither side edge of the display device 10 of FIG. 1 will include a bezel, with an effect of expanding the display area DA.

FIG. 3 is a schematic cross-sectional view of a part of the display panel 100 of FIG. 2. In FIG. 3, the display panel 100 is an organic light-emitting display panel that includes an organic light-emitting device 310. However, embodiments of the present disclosure are not limited thereto. The display panel 100 may include other types of display devices, such as a liquid crystal device.

According to an embodiment, the substrate 101 is formed of, for example, a transparent glass that uses silicon dioxide ($SiO_2$) as a main component. However, the substrate 101 is not limited thereto, and may be formed of a plastic. The plastic includes a polymer resin such as polyethersulphone, (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). Alternatively, the substrate 101 can be variously modified, for example, to include a metal, etc.

According to an embodiment, a thin-film transistor TFT is disposed in the display area DA of the substrate 101. In addition to the thin-film transistor TFT, the organic light-emitting device 310 electrically connected to the thin-film transistor TFT is disposed in the display area DA. In particular, a pixel electrode 311 of the organic light-emitting device 310 is connected to the thin-film transistor TFT. A thin-film transistor is also disposed in the peripheral area PA of the substrate 101. The thin-film transistor in the peripheral area PA may be, for example, a part of a circuit that controls an electrical signal transmitted to the display area DA.

According to an embodiment, the thin-film transistor TFT includes a semiconductor layer 111 that includes amorphous silicon, polycrystalline silicon, or an organic semiconductor material, a gate electrode 113, a source electrode 115a, and a drain electrode 115b. A buffer layer 110 formed of an inorganic material such as silicon oxide, silicon nitride, or silicon oxynitride, etc., is disposed on the substrate 101 to planarize a surface of the substrate 101 or prevent impurities from penetrating into the semiconductor layer 111. The semiconductor layer 111 is disposed on the buffer layer 110.

According to an embodiment, the gate electrode 113 is disposed on the semiconductor layer 111. According to a signal received by the gate electrode 113, the source electrode 115a is electrically connected to the drain electrode 115b. The gate electrode 113 includes, for example, one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), or copper (Cu). The gate electrode 113 may have a single-layered or multi-layered structure. To insulate the semiconductor layer 111 from the gate electrode 113, a gate insulating layer 121 formed of an inorganic material such as silicon oxide, silicon nitride, or silicon oxynitride, etc., is disposed between the semiconductor layer 111 and the gate electrode 113.

According to an embodiment, an interlayer insulation layer 131 is disposed on the gate electrode 113. The interlayer insulation layer 131 is formed of an inorganic material such as silicon oxide, silicon nitride, or silicon oxynitride, etc., and may have a single-layered or multi-layered structure.

According to an embodiment, the source electrode 115a and the drain electrode 115b are disposed on the interlayer insulation layer 131. The source electrode 115a and the drain electrode 115b are both electrically connected to the semiconductor layer 111 via a contact hole formed in the interlayer insulation layer 131 and the gate insulating layer 121. The source electrode 115a and the drain electrode 115b include, for example, one or more of Al, Pt, Pd, Ag, Mg, Au, Ni, Nd, Ir, Cr, Li, Ca, Mo, Ti, W, or Cu, depending on a desired conductivity, etc. The source electrode 115a and the drain electrode 115b may have a single-layered or multi-layered structure.

According to an embodiment, to protect the thin-film transistor TFT having such a structure, a protective layer is disposed that covers the thin-film transistor TFT. The protective layer is formed of an inorganic material such as silicon oxide, silicon nitride, or silicon oxynitride, etc. The protective layer may include a single layer or multiple layers.

According to an embodiment, a planarization layer 140 is disposed over the protective layer. For example, as shown in FIG. 3, when the organic light-emitting device 310 is disposed above the thin-film transistor TFT, the planarization layer 140 planarizes a whole upper surface of the protective layer that covers the thin-film transistor TFT. The planarization layer 140 includes, for example, an organic material such as acryl, benzocyclobutene (BCB), or hexamethyldisiloxane (HMDSO), etc. FIG. 3 shows the planarization layer 140 as having a single layer. However, embodiments are not limited thereto, and the planarization layer 140 may include multiple layers.

In a current embodiment, the display panel 100 may include both the protective layer and the planarization layer 140, or include just the planarization layer 140 as needed.

According to an embodiment, in the display area DA of the substrate 101, the pixel electrode 311, an intermediate layer 315 that includes a light-emitting layer, and an opposite electrode 313 are disposed on the planarization layer 140.

According to an embodiment, an opening that exposes at least one of the source electrode 115a and the drain electrode 115b is formed in the planarization layer 140. The pixel electrode 311 is disposed on the planarization layer 140 and contacts either the source electrode 115a or the drain electrode 115b via the opening, to be electrically connected to the thin-film transistor TFT. The pixel electrode 311 may include a (semi)transparent electrode or a reflective electrode. When the pixel electrode 311 is a (semi)transparent electrode, the pixel electrode 311 includes at least one of indium tin oxide (ITO), indium zinc oxide (IZO), zinc oxide (ZnO), indium oxide ($In_2O_3$), indium gallium oxide (IGO) or aluminum zinc oxide (AZO). When the pixel electrode 311 is a reflective electrode, the pixel electrode 311 has a reflective layer formed of at least one of Ag, Mg, Al, Pt, Pd, Au, Ni, Nd, Ir, Cr, or a compound thereof, etc., and a layer formed of ITO, IZO, ZnO, $In_2O_3$, IGO, or AZO. However, embodiments of the present disclosure are not limited thereto, and the pixel electrode 311 may include various other materials. The pixel electrode 311 may also have a single-layered or multi-layered structure.

According to an embodiment, a pixel-defining layer 150 is disposed on the planarization layer 140. The pixel-defining layer 150 has an opening that corresponds to each subpixel, that is, an opening that exposes at least a central portion of the pixel electrode 311, that forms a pixel. In addition, in the case shown in FIG. 3, the pixel-defining layer 150 prevents generation of arcs, etc., at edges of the pixel electrode 311 by increasing a distance between the edges of the pixel electrode 311 and the opposite electrode 313 above the pixel electrode 311. The pixel-defining layer 150 includes, for example, an organic material such as PI or HMDSO, etc.

According to an embodiment, the intermediate layer 315 of the organic light-emitting device 310 includes a low-molecular weight or polymer material. When the intermediate layer 315 includes a low-molecular weight material, the intermediate layer 315 has a stacked structure that includes a hole injection layer (HIL), a hole transport layer (HTL), an emission layer (EML), an electron transport layer (ETL), or an electron injection layer (EIL), etc., and includes various organic materials such as copper phthalocyanine (CuPc), N,N'-Di(naphthalene-1-yl)-N,N'-diphenyl-benzidine (NPB), or tris-8-hydroxyquinoline aluminum (Alq3), etc. Such layers can be formed by a vacuum deposition method.

According to an embodiment, when the intermediate layer 315 includes a polymer material, the intermediate layer 315 has a structure that includes, for example, an HTL and an EML. The HTL includes poly-(2,4)-ethylene-dihydroxy thiophene (PEDOT), and the EML includes a polymer material such as poly-phenylenevinylene (PPV) or polyfluorene, etc. The intermediate layer 315 may be formed by a screen printing or inkjet printing method, a laser induced thermal imaging (LITI) method, etc.

However, according to embodiments, the intermediate layer 315 is not limited thereto, and may have various other structures.

According to an embodiment, the opposite electrode 313 is disposed over the display area DA. As shown in FIG. 3, the opposite electrode 313 covers the display area DA. That is, the opposite electrode 313 is formed as one body with respect to a plurality of the organic light-emitting devices 310 and corresponds to a plurality of the pixel electrodes 311. The opposite electrode 313 may include a (semi)transparent electrode or a reflective electrode. When the opposite electrode 313 includes a (semi)transparent electrode, the opposite electrode 313 includes a layer formed of a metal with a low work function, such as Li, Ca, lithium-fluoride-calcium (LiF/Ca), lithium-fluoride-aluminum (LiF/Al), Al, Ag, Mg, or a compound thereof, and a (semi) transparent conductive layer formed of ITO, IZO, ZnO, or $In_2O_3$, etc. When the opposite electrode 313 includes a reflective electrode, the opposite electrode 313 includes a layer formed of at least one of Li, Ca, LiF/Ca, LiF/Al, Al, Ag, Mg, or a compound thereof. However, embodiments are not limited thereto, and the opposite electrode 313 can be variously modified with other structures and materials.

According to an embodiment, since a display device such as the organic light-emitting device 310 includes the opposite electrode 313, a preset electrical signal needs to be transmitted to the opposite electrode 313 to display an image. Accordingly, an electrode power-supply line 420 is disposed in the peripheral area PA to transmit the preset electrical signal to the opposite electrode 313.

According to an embodiment, when various conductive layers are formed in the display area DA, the electrode power-supply line 420 is formed of a same material as that of the conductive layers and at the same time as the conductive layers. FIG. 3 shows that the electrode power-supply line 420 is disposed on the interlayer insulating layer 131 in the peripheral area PA, like the source electrode 115a and the drain electrode 115b of the thin-film transistor TFT, which are disposed on the interlayer insulating layer 131 in the display area DA. In this case, when the source electrode 115a and the drain electrode 115b are formed on the interlayer insulating layer 131 in the display area DA, the electrode power-supply line 420 is formed on the interlayer insulating layer 131 in the peripheral area PA of a same material as that of the source electrode 115a and the drain electrode 115b and at the same time as the source electrode 115a and the drain electrode 115b. Accordingly, the electrode power-supply line 420 has a same structure as that of the source electrode 115a and the drain electrode 115b. However, embodiments of the present disclosure are not limited thereto. Various modifications may be made, such as forming the electrode power-supply line 420 on the gate insulating layer 121 using a same material as that of the gate electrode 113 and at the same time as the gate electrode 113.

According to an embodiment, the opposite electrode 313 does not directly contact the electrode power-supply line 420, but is electrically connected to the electrode power-supply line 420 via a protective conductive layer 422, as shown in FIG. 3. That is, the protective conductive layer 422 is disposed on the planarization layer 140 and extends over the electrode power-supply line 420 to connect to the electrode power-supply line 420. Accordingly, the opposite electrode 313 contacts the protective conductive layer 422 in the peripheral area PA, and the protective conductive layer 422 contacts the electrode power-supply line 420 in the peripheral area PA.

As shown in FIG. 3, according to an embodiment, since the protective conductive layer 422 is disposed on the planarization layer 140, the protective conductive layer 422 can be formed at the same time and of the same materials as that of component disposed on the planarization layer 140 in the display area DA. In detail, when the pixel electrode 311 in the display area DA is formed on the planarization layer 140, the protective conductive layer 422 is formed on the planarization layer 140 in the peripheral area PA of the same material as that of the pixel electrode 311 and at the same time as the pixel electrode 311. Accordingly, the protective conductive layer 422 has the same structure as that of the pixel electrode 311. As shown in FIG. 3, the protective conductive layer 422 is not covered by the planarization layer 140 but covers an exposed part of the electrode power-supply line 420. Thus, as described herein, in a process of forming a first restriction dam 610 or a second restriction dam 620, to be described below, damage to the electrode power-supply line 420 can be prevented.

According to an embodiment, to prevent an impurity such as oxygen, moisture, etc., from penetrating into the display area DA via the planarization layer 140, the planarization layer 140 has an opening 140b in the peripheral area PA, as shown in FIG. 3. In addition, when the protective conductive layer 422 is formed, the protective conductive layer 422 fills the opening 140b. Thus, when an impurity has penetrated into the planarization layer 140 in the peripheral area PA, the impurity can be effectively prevented from penetrating into the planarization layer 140 in the display area DA.

According to an embodiment, a capping layer 160 is disposed on the opposite electrode 313, and the capping layer 160 enhances the efficiency of light generated by the organic light-emitting device 310. The capping layer 160 covers the opposite electrode 313 and extends outward from the opposite electrode 313 to contact the protective conductive layer 422 below the opposite electrode 313. Since the opposite electrode 313 covers the display area DA and extends toward the edge of the display area DA, the capping layer 160 also covers the display area DA up to the boundary of the peripheral area PA outside of the display area DA. To enhance light efficiency, the capping layer 160 includes one or more organic materials or inorganic materials such as silicon dioxide ($SiO_2$), silicon nitride ($SiN_x$), zinc peroxide ($ZnO_2$), titanium dioxide ($TiO_2$), zirconium dioxide ($ZrO_2$), indium tin oxide (ITO), indium zinc oxide (IZO), tris-8-hydroxyquinoline aluminum (Alq3), copper phthalocyanine (CuPc), 4,4'-bis(N-carbazolyl)-1,1'-biphenyl (CBP), or N,N'-di(naphthalene-1-yl)-N,N'-diphenyl-benzidine (a-NPB).

As described above, according to an embodiment, the capping layer 160 enhances the efficiency of light generated from the organic light-emitting device 310. For example, the capping layer 160 may improve an optical extraction efficiency. The capping layer 160 uniformly enhances the efficiency of light in the display area DA. For uniform enhancement of the efficiency of light, the capping layer 160 has an upper surface that conforms to the shape of an upper surface of a layer below the capping layer 160. That is, as shown in FIG. 3, in an area of the capping layer 160 on the opposite electrode 313, the upper surface of the capping layer 160 conforms to the shape of an upper surface of the opposite electrode 313.

According to an embodiment, an encapsulation layer 500 is disposed over the capping layer 160. The encapsulation layer 500 protects the organic light-emitting device 310 from external moisture or oxygen. To do so, the encapsulation layer 500 extends over not only the display area DA but also the peripheral area PA outside of the display area DA. As shown in FIG. 3, the encapsulation layer 500 has a multi-layered structure. In detail, the encapsulation layer 500 includes a first inorganic encapsulation layer 510, an organic encapsulation layer 520, and a second inorganic encapsulation layer 530.

According to an embodiment, the first inorganic encapsulation layer 510 covers the capping layer 160 and includes at least one of silicon oxide, silicon nitride, or silicon oxynitride, etc. Since the first inorganic encapsulation layer 510 conforms to the structure below, an upper surface of the first inorganic encapsulation layer 510 is not flat, as shown in FIG. 3.

According to an embodiment, since the organic encapsulation layer 520 covers the first inorganic encapsulation layer 510 and is thicker than the first inorganic encapsulation layer 510, an upper surface of the organic encapsulation layer 520 relatively flat over the whole display area DA. The organic encapsulation layer 520 includes one or more of PET, PEN, PC, PI, polyethylene sulfonate, polyoxymethylene, polyacrylate, or HMDSO.

According to an embodiment, the second inorganic encapsulation layer 530 covers the organic encapsulation layer 520 and includes at least one of silicon oxide, silicon nitride, or silicon oxynitride, etc. The second inorganic encapsulation layer 530 extends outward from the organic encapsulation layer 520, contacting the first inorganic encapsulation layer 510 in the peripheral area PA, thus protecting the organic encapsulation layer 520 from being externally exposed.

As such, according to an embodiment, since the encapsulation layer 500 includes the first inorganic encapsulation layer 510, the organic encapsulation layer 520, and the second inorganic encapsulation layer 530, even when cracks occur in the encapsulation layer 500, the cracks will not connect to each other between the first inorganic encapsulation layer 510 and the organic encapsulation layer 520 or between the organic encapsulation layer 520 and the second inorganic encapsulation layer 530, due to the multi-layered structure of the encapsulation layer 500. Thus, the forming of a path via which external moisture or oxygen penetrates into the display area DA can be prevented or minimized.

According to an embodiment, when forming the encapsulation layer 500, structures below the encapsulation layer 500 may be damaged. For example, the first inorganic encapsulation layer 510 can be formed by a chemical vapor deposition method. When the first inorganic encapsulation layer 510 is formed by chemical vapor deposition, a layer directly below the first inorganic encapsulation layer 510 can be damaged. Accordingly, when the first inorganic encapsulation layer 510 is formed directly on the capping layer 160, if the capping layer 160 is damaged, light efficiency of the display device 10 can deteriorate. Accordingly, to prevent damage to the capping layer 160 when forming the encapsulation layer 500, a protective layer 170 is disposed between the capping layer 160 and the encapsulation layer 500. The protective layer 170 includes lithium fluoride (LiF).

As described above, according to an embodiment, the capping layer 160 extends not only over the display area DA but also into the peripheral area PA outside the display area DA. Accordingly, the protective layer 170 extends toward the edge of the capping layer 160 so that the capping layer 160 does not directly contact the encapsulation layer 500. In this case, the protective layer 170 covers an end of the capping layer 160 so that an end of the protective layer 170 is disposed over the planarization layer 140. In detail, as shown in FIG. 3, the end of the protective layer 170 directly contacts the protective conductive layer 422 over the planarization layer 140.

According to an embodiment, the first inorganic encapsulation layer 510, which is a lowest layer in the encapsulation layer 500, has a greater bonding strength with a layer formed of an inorganic material than that with a layer formed of an organic material. Accordingly, when the capping layer 160 includes an organic material and the protective layer 170 is formed of an inorganic material such as LiF, since the bonding strength between the inorganic protective layer 170 and the first inorganic encapsulation layer 510 is greater than that between the organic capping layer 160 and the first inorganic encapsulation layer 510, the encapsulation layer 500 is more strongly bonded with a layer below the encapsulation layer 500. Accordingly, in a process of manufacturing the display device or using the display device after manufacture, delamination of the encapsulation layer 500 from the layer below the encapsulation layer 500 can be effectively prevented or minimized.

In detail, according to an embodiment, when the encapsulation layer 500 is formed, a material of the organic encapsulation layer 520 needs to be confined to a predetermined area. To do so, as shown in FIG. 3, the first restriction dam 610 is disposed in the peripheral area PA. In detail, as shown in FIG. 3, the buffer layer 110, the gate insulating layer 121, the interlayer insulating layer 131, and the planarization layer 140 are disposed in the peripheral area PA as well as in the display area DA of the substrate 101. The first restriction dam 610 is disposed in the peripheral area PA, separate from the planarization layer 140.

According to an embodiment, the first restriction dam 610 has a multi-layered structure. That is, the first restriction dam 610 includes a first layer 611, a second layer 613 and a third layer 615 above the substrate 101. The first layer 611 is formed of a same material as that of the planarization layer 140 and at the same time as the planarization layer 140. The second layer 613 is formed of a same material as that of the pixel-defining layer 150 and at the same time as the pixel-defining layer 150. The third layer 615 is formed of a same material as that of the pixel-defining layer 150.

As shown in FIG. 3, according to an embodiment, in addition to the first restriction dam 610, the second restriction dam 620 is formed between the first restriction dam 610 and the planarization layer 140. The second restriction dam 620 is disposed on a part of the protective conductive layer 422 over the electrode power-supply line 420. The second restriction dam 620 is also disposed in the peripheral area PA, separate from the planarization layer 140. The second restriction dam 620 has a multi-layered structure like the first restriction dam 610, and includes a lower layer 623 that is simultaneously formed with the second layer 613 of the first restriction dam 610 and an upper layer 625 disposed on the lower layer 623. Thus, the second restriction dam 620 includes fewer layers than the first restriction dam 610 and has a height from the substrate 101 less than that of the first restriction dam 610. FIG. 3 shows that the lower layer 623 is formed of a same material as that of the second layer 613 of the first restriction dam 610 and at same time as the second layer 613, and that the upper layer 625 formed from the same material as the third layer 615 of the first restriction dam 610.

As shown in FIG. 3, according to an embodiment, when the first inorganic encapsulation layer 510 of the encapsulation layer 500 is formed by a chemical vapor deposition, the first inorganic encapsulation layer 510 covers the second restriction dam 620 and the first restriction dam 610, thereby extending to the outer edge of the first restriction dam 610. The material for forming the organic encapsulation layer 520 on the first inorganic encapsulation layer 510 is confined by the second restriction dam 620 to prevent the material from overflowing out from the second restriction dam 620 when the organic encapsulation layer 520 is formed. Even when some of the material for forming the organic encapsulation layer 520 overflows out from the second restriction dam 620, since material of the organic encapsulation layer 520 is also confined by the first restriction dam 610, the material for forming the organic encapsulation layer 520 does not flow further toward an edge of the substrate 101.

As shown in FIG. 3, according to an embodiment, a crack prevention dam 630 is disposed in the peripheral area PA. The crack prevention dam 630 extends along at least a part of the edge of the substrate 101. For example, the crack prevention dam 630 surrounds the whole display area DA. In some areas, the crack prevention dam 630 may be disconnected.

According to an embodiment, the crack prevention dam 630 can have various shapes. As shown in FIG. 3, the crack prevention dam 630 is formed of a same material as that of some components in the display area DA, and may have a multi-layered structure. FIG. 3 shows the crack prevention dam 630 as having a two-layered structure. In detail, FIG. 3 shows that the crack prevention dam 630 includes a lower layer formed of a same material as the gate insulating layer 121, and an upper layer formed of a same material as the interlayer insulating layer 131 on the gate insulating layer 121. The crack prevention dam 630 is disposed on the buffer layer 110. As needed, the crack prevention dam 630 may be disposed on a layer below the buffer layer 110 and include a layer having the same material as that of the buffer layer 110. Alternatively, a plurality of the crack prevention dams 630, instead of one crack prevention dam 630, may be disposed, separated from each other.

According to an embodiment, the crack prevention dam 630 is formed by removing a portion of the gate insulating layer 121 and the interlayer insulating layer 131. That is, as shown in FIG. 3, a transmission preventing groove 632 is formed at least on one side of the crack prevention dam 630 by removing portions of the gate insulating layer 121 and the interlayer insulating layer 131. Thus, the crack prevention dam 630 includes remaining portions of the gate insulating layer 121 and the interlayer insulating layer 131 adjacent to the transmission preventing groove 632.

According to an embodiment, the crack prevention dam 630 is covered by a cover layer 650. The cover layer 650 is, for example, formed of a same material as that of the planarization layer 140 when the planarization layer 140 is formed in the display area DA. That is, the cover layer 650 is formed of an organic material that covers the crack prevention dam 630, which includes an inorganic material. The cover layer 650 fills the transmission preventing groove 632 and covers the crack prevention dam 630.

Figure 4:
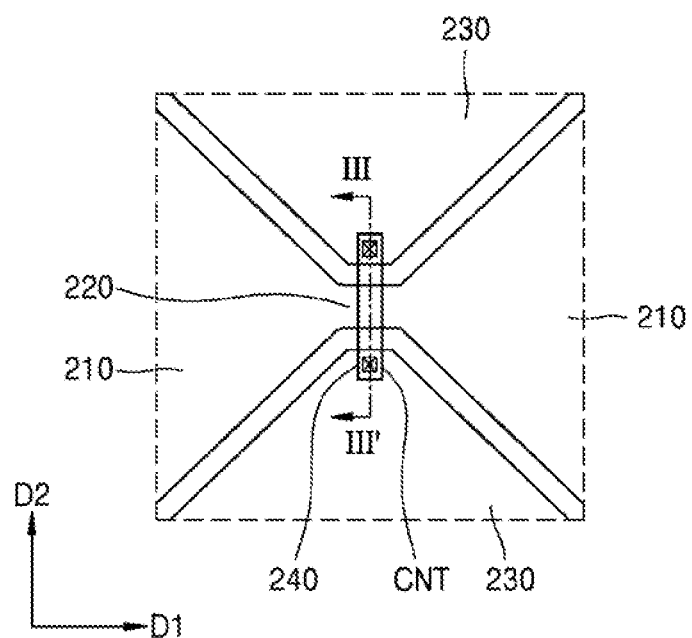
FIG. 4 is a schematic plan view of part A of FIG. 1.
Figure 5:
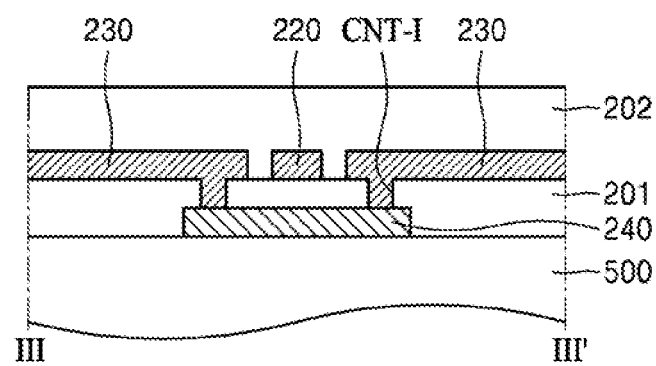
FIG. 5 is a schematic cross-sectional view of a display panel of FIG. 4 taken along a line III-III'.

FIG. 4 is a schematic plan view of a part A of FIG. 1. FIG. 5 is a schematic cross-sectional view of an example of the display panel 100 of FIG. 4 taken along a line III-III'.

Referring to FIGS. 4 and 5, according to embodiments, the input detection unit 200 of FIG. 1 is disposed directly on the display panel 100 of FIG. 1. For example, the input detection unit 200 of FIG. 1 is disposed directly on the encapsulation layer 500. Accordingly, a thickness of the display device 10 of FIG. 1 may be reduced. For example, after the input detection unit 200 of FIG. 1 is formed on a substrate, the substrate is bonded to the encapsulation layer 500.

According to an embodiment, the first detection electrodes 210 and the second detection electrodes 230 are formed of a transparent conductive layer. The transparent conductive layer includes a transparent conductive oxide such as ITO, IZO, ZnO, or indium tin zinc oxide (ITZO), etc. In addition, the transparent conductive layer includes a conductive polymer such as PEDOT, a metal nano-wire, graphene, etc. For example, the first detection electrodes 210 and the second detection electrodes 230 are formed of a transparent metal layer. In this case, the first detection electrodes 210 and the second detection electrodes 230 are formed as a mesh form to be transparent.

According to an embodiment, two first detection electrodes 210 adjacent to each other along the first direction D1 are connected to each other via a connector 220. The connector 220 is disposed on a same layer as that of the first detection electrode 210. The connector 220 is integrally formed with the first detection electrodes 210.

According to an embodiment, two second detection electrodes 230 adjacent to each other along the second direction D2 perpendicular to the first direction D1 are connected to each other via a bridge wire 240. The bridge wire 240 is disposed on a different layer from that of the first and second detection electrodes 210 and 230. For example, the bridge wire 240 is disposed on the encapsulation layer 500, a first insulating layer 201 is disposed on the bridge wire 240, and the first and second detection electrodes 210 and 230 are disposed over the first insulating layer 201. In this case, the bridge wire 240 is electrically connected to the second detection electrodes 230 via first contact holes CNT-I in the first insulating layer 201. In addition, a second insulating layer 202 is disposed over the first and second detection electrodes 210 and 230.

According to an embodiment, since the bridge wire 240 crosses the connector 220, a width of the bridge wire 240, when measured in a plane, is minimized to reduce parasitic capacitance between the bridge wire 240 and the connector 220. In addition, the bridge wire 240 includes a material having a lower resistance than the second detection electrodes 230 to enhance sensing sensitivity. For example, the bridge wire 240 includes one or more of Mo, Ag, Ti, Cu, or Al, or an alloy thereof.

According to an embodiment, at least one of the first insulating layer 201 and the second insulating layer 202 includes an inorganic layer. The inorganic layer is at least one of aluminum oxide, titanium oxide, silicon oxide, silicon oxynitride, zirconium oxide, or hafnium oxide.

According to an embodiment, at least one of the first insulating layer 201 and the second insulating layer 202 includes an organic layer. The organic layer is at least one of an acrylic-based resin, a meth acrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment, the first insulating layer 201 and the second insulating layer 202 are disposed over the whole display area DA of the display panel 100, and the input detection unit 200 is disposed on the display panel 100. Thus, a refractive index of the first insulating layer 201 is less than that of the second insulating layer 202, thus enhancing the optical extraction efficiency of the display panel 100 of FIG. 2.

FIGS. 4 and 5 show an embodiment in which the bridge wire 240 is disposed on a layer below that of the connector 220. However, embodiments of the present disclosure are not limited thereto, and the bridge wire 240 may be disposed on a layer above that of the connector 220. In addition, two or more bridge wire 240 may be used.

In addition, according to an embodiment, a floating dummy pattern that is not connected to the first detection electrode 210 or the second detection electrode 230 is further disposed between the first detection electrode 210 and the second detection electrode 230. Since the dummy pattern is disposed in a same layer as that of the first detection electrode 210 and the second detection electrode 230, visibility of a border between the first detection electrode 210 and the second detection electrode 230 is reduced.

Figure 7:
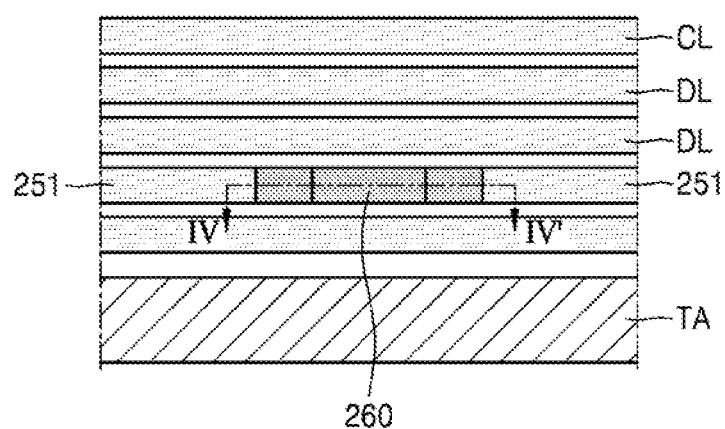
FIG. 7 is a schematic plan view of part C of FIG. 6.
Figure 8:
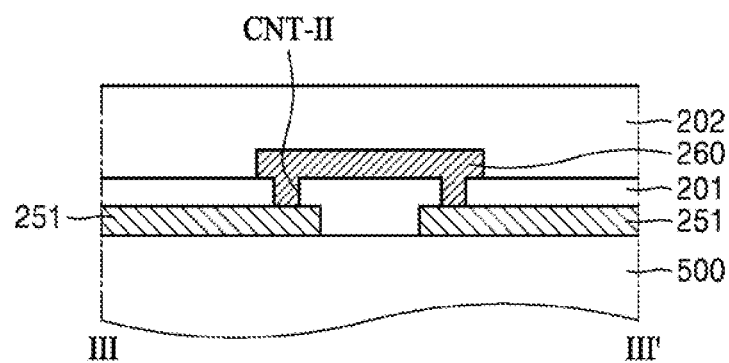
FIG. 8 is a schematic cross-sectional view of a display panel of FIG. 7 taken along a line IV-IV'.

FIG. 6 is a schematic plan view of a part B of FIG. 1. FIG. 17 is a schematic plan view of a part C of FIG. 6. FIG. 8 is a schematic cross-sectional view of an example of the display panel 100 of FIG. 7 taken along lines IV-IV'. Hereinafter, a description is provided with reference to FIGS. 1 and 6 to 8. In addition, for convenience of description, an area in which the first detection electrodes 210 and the second detection electrodes 230 are disposed is referred to as a touch area TA.

Referring to FIGS. 1 and 6 to 8, according to an embodiment, the first detection electrode array 210-1 has a section cut out by the concave portion T. Accordingly, the first detection electrodes 210 of the first detection electrode array 210-1 on both sides of the concave portion T are electrically connected to each other by the connection wire 250. The connection wire 250 is disposed over the encapsulation layer 500 outside the touch area TA.

According to an embodiment, the connection wire 250 includes a plurality of segments 251 separate from each other and conjunction portions 260 that electrically connect two adjacent segments 251.

According to an embodiment, the plurality of segments 251 are disposed on a same layer as that of the bridge wire 240 shown in and described with reference to FIGS. 4 and 5, and include a same material as that of the bridge wire 240 of FIG. 4. In addition, the conjunction portions 260 are disposed on a same layer as that of the first and second detection electrodes 210 and 230, and include a same material as that of the first and second detection electrodes 210 and 230.

Accordingly, in an embodiment, the plurality of segments 251 are disposed on the encapsulation layer 500, the first insulating layer 201 is disposed on the plurality of segments 251, and the conjunction portion 260 is disposed on the first insulating layer 201. In this case, the conjunction portions 260 are electrically connected to the plurality of segments 251 via a second contact holes CNT-II in the first insulating layer 201. In addition, the second insulating layer 202 is disposed on the conjunction portions 260.

As such, according to an embodiment, when the connection wire 250 includes a plurality of segments 251, the amount of electric charges accumulated in the connection wire 250 is reduced as compared to when the connection wire 250 is formed as one body. Accordingly, a phenomenon in which the first insulating layer 201 or the second insulating layer 202 are destroyed when the accumulated electric charges are discharged can be prevented, and damage to the input detection unit 200 can be prevented or reduced.

According to an embodiment, the input detection unit 200 includes a connection line CL that connects the first detection electrodes 210 or the second detection electrodes 230 to a pad, and dummy lines DL in a floating state are disposed in a periphery of the touch area TA. That is, by placing the dummy lines DL in an empty space in the periphery of the touch area TA, visibility of the connection line CL can be reduced. In addition, since the connection line CL, the dummy lines DL, and the plurality of segments 251 are disposed on a same layer, the dummy lines DL are disposed between the connection line CL and the plurality of segments 251 to prevent a short circuit between the connection line CL and the plurality of segments 251.

Figure 9:
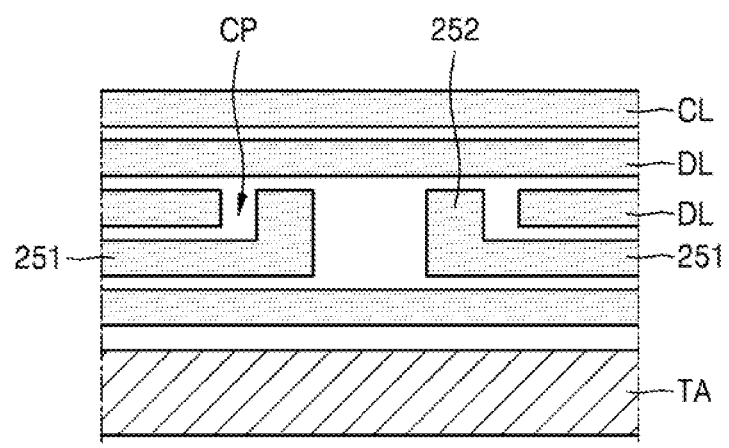
FIGS. 9 and 10 are schematic plan views of other examples of part C of FIG. 6.
Figure 10:
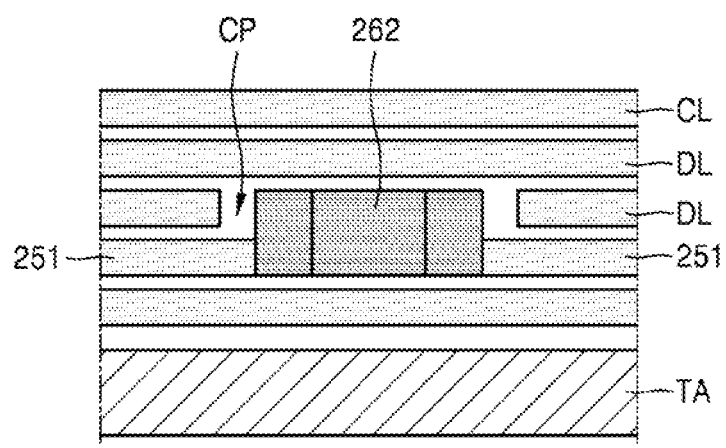

FIGS. 9 and 10 are schematic plan views of other examples of part C of FIG. 6.

Referring to FIGS. 9 and 10, according to an embodiment, the connection line CL, the dummy lines DL, and the segments 251 are disposed outside the touch area TA. The dummy lines DL disposed between the connection line CL and the segments 251 include a cut portion CP of which a part is removed. The segments 251 include expanded portions 252 that extend from ends of the segment 251 into the cut portion CP. The expanded portions 252 may be wider than a width of the segments 251. In addition, a connector 262 that connects the segments 251 with each other is disposed that overlaps the expanded portion 252. A contact hole that connects the connector 262 to the expanded portion 252 is larger than that of the second contact hole CNT-II of FIG. 8. Alternatively, the connector 262 is connected to the expanded portion 252 via a plurality of contact holes.

As described above, according to an embodiment, a width of the connection wire 250 needs to be adjusted so that a resistance value of the first detection electrode array 210-1 that includes the pair of first detection electrodes 210 electrically connected to each other via the connection wire 250 is equal to that of the other first detection electrode array 210-2 in which the first detection electrodes 210 are consecutively disposed. Accordingly, the segments 251 include the expanded portion 252 so that, even when a width of the connection wire 250 is small, the first detection electrode array 210-1 has a same resistance as that of the other first detection electrode array 210-2.

According to embodiments, since a connection wire that connects first detection electrodes on both sides of a concave portion of a display device includes a plurality of segments, the amount of electric charges accumulated in the connection wire is reduced, thereby preventing an input detection unit from being damaged by electrostatic discharge. However, embodiments of the present disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device, comprising:
a display panel that includes a concave portion at a side of the display panel; and
an input detection unit disposed over the display panel, wherein the input detection unit includes
a plurality of first detection electrodes electrically connected to each other in a first direction,
a plurality of second detection electrodes electrically connected to each other in a second direction perpendicular to the first direction, wherein the plurality of first detection electrodes and the plurality of second detection electrodes are configured to detect a contact with an external touch unit, and
a connection wire that electrically connects a pair of the first detection electrodes disposed at both sides of the concave portion,
wherein the connection wire includes a plurality of segments separate from each other and conjunction portions that electrically connect two adjacent segments to each other, and
the conjunction portions are disposed on a same layer as that of the first detection electrodes and the second detection electrodes, and the plurality of segments are disposed on a different layer from that of the second detection electrodes.

2. The display device of claim 1, wherein the input detection unit further comprises
a connector that connects two adjacent first detection electrodes, and
a bridge electrode that connect two adjacent second detection electrodes,
the connector is disposed on a same layer as that of the first detection electrodes and the second detection electrodes, and
the bridge electrode is disposed on a different layer from that of the second detection electrodes, and
the plurality of segments are disposed on a same layer as that of the bridge electrode.

3. The display device of claim 2, wherein
the input detection unit further comprises a first insulating layer between the bridge electrode and the second detection electrodes and between the segments and the conjunction portion, and
the bridge electrode is connected to the second detection electrodes via first contact holes formed in the first insulating layer, and
the segments are connected to the conjunction portions via second contact holes formed in the first insulating layer.

4. The display device of claim 3, wherein
the bridge electrode is disposed on a layer that is lower than that of the second detection electrodes,
the input detection unit further comprises a second insulating layer disposed over the conjunction portion, and
a refractive index of the first insulating layer is less than a refractive index of the second insulating layer.

5. The display device of claim 1, wherein
the input detection unit comprises a touch area in which the plurality of first detection electrodes and the plurality of second detection electrodes are disposed, and
the connection wire is disposed outside the touch area.

6. The display device of claim 5, wherein the input detection unit comprises
a connection line connected to the plurality of first detection electrodes or the plurality of second detection electrodes, and a dummy line in a floating state,
wherein the connection line and the dummy line are disposed outside the touch area, and
the dummy line is disposed between the connection line and the connection wire.

7. The display device of claim 6, wherein
the dummy line comprises a cut portion obtained by removing a part of the dummy line, and
the plurality of segments respectively further comprise an expanded portion that extends from an end of the plurality of segments into the cut portion.

8. The display device of 1, wherein the input detection unit is disposed directly on the display panel.

9. The display device of claim 1, wherein the display panel comprises an organic light-emitting device.

10. A display device, comprising:
a display panel that includes a concave portion at a side of the display panel; and
an input detection unit disposed over the display panel, wherein the input detection unit includes
a plurality of first detection electrode arrays in which a plurality of first detection electrodes are electrically connected to each other and extend parallel to each other in a first direction, and the plurality of first detection electrode arrays are spaced apart from each other in a second direction perpendicular to the first direction,
a first detection electrode array of the plurality of first detection electrode arrays is cut by the concave portion and includes a pair of first detection electrodes disposed at both sides of the concave portion, and
the pair of first detection electrodes are electrically connected to each other via a connection wire that bypasses the concave portion, and
a resistance value of the cut first detection electrode array is identical to a resistance value of other detection electrode arrays of the plurality of first detection electrode arrays in which the first detection electrodes are consecutively disposed.

11. The display device of claim 10, wherein the connection wire comprises
a plurality of separate segments, and
conjunction portions that electrically connect adjacent segments of the plurality of separate segments to each other.

12. The display device of claim 11, wherein
the input detection unit comprises a touch area in which the plurality of first detection electrodes are disposed, and
the connection wire is disposed outside the touch area.

13. The display device of claim 12, wherein the input detection unit further comprises a plurality of second detection electrodes electrically connected to each other in the second direction.

14. The display device of claim 13, wherein the input detection unit further comprises
a connection line connected to the plurality of first detection electrodes or the plurality of second detection electrodes, and
a dummy line in a floating state that are disposed outside the touch area,
wherein the dummy line is disposed between the connection line and the connection wire.

15. The display device of claim 14, wherein
the dummy line comprises a cut portion obtained by removing a part of the dummy line, and
the plurality of separate segments further comprise expanded portions that extend from the end of the plurality of separate segments into the cut portion.

16. The display device of claim 11, wherein the input detection unit further comprises
a connector that connects two adjacent first detection electrodes, and
a bridge electrode that connect two adjacent second detection electrodes,
wherein the connector is disposed on a same layer as that of the first detection electrodes and the second detection electrodes, and
the bridge electrode is disposed on a different layer from that of the second detection electrodes, and
the conjunction portion is disposed on a same layer as that of the first detection electrodes and the second detection electrodes, and
the plurality of separate segments are disposed on a same layer as that of the bridge electrode.

17. The display device of claim 16, wherein the input detection unit further comprises
a first insulating layer between the bridge electrode and the second detection electrodes, and between the plurality of separate segments and the connector,
wherein the bridge electrode is connected to the second detection electrodes via first contact holes formed in the first insulating layer, and
the plurality of separate segments are connected to the connector via second contact holes formed in the first insulating layer.

18. The display device of claim 17, wherein
the bridge electrode is disposed on a layer lower than that of the second detection electrodes,
the input detection unit further comprises a second insulating layer disposed over the conjunction portion, and
a refractive index of the first insulating layer s than a refractive index of the second insulating layer.

19. The display device of claim 10, wherein
the display panel comprises an organic light-emitting device and an encapsulation layer that protects the organic light-emitting device, and
the input detection unit is disposed directly on the encapsulation layer.

20. A display device, comprising:
a display panel that includes a concave portion at a side of the display panel; and
an input detection unit disposed over the display panel, wherein the input detection unit includes
a plurality of first detection electrodes electrically connected to each other in a first direction and spaced apart from each other in a second direction perpendicular to the first direction,
a plurality of second detection electrodes electrically connected to each other in the second direction,
wherein the plurality of first detection electrodes and the plurality of second detection electrodes are configured to detect a contact with an external touch unit,
a connection wire that electrically connects a pair of the first detection electrodes disposed at both sides of the concave portion that are separated by the concave portion,
a connector that connects two adjacent first detection electrodes, and
a bridge electrode that connect two adjacent second detection electrodes, wherein the connector is disposed on a same layer as that of the first detection electrodes and the second detection electrodes, and the bridge electrode is disposed on a different layer from that of the second detection electrodes.

* * * * *